United States Patent
Michaud et al.

(10) Patent No.: US 9,672,148 B1
(45) Date of Patent: Jun. 6, 2017

(54) METHODS AND APPARATUS FOR DIRECT CACHE-LINE ACCESS TO ATTACHED STORAGE WITH CACHE

(71) Applicant: EMC Corporation, Hopkinton, MA (US)

(72) Inventors: Adrian Michaud, Carlisle, MA (US); Roy E. Clark, Hopkinton, MA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 55 days.

(21) Appl. No.: 14/318,939

(22) Filed: Jun. 30, 2014

Related U.S. Application Data (60) Provisional application No. 62/004,163, filed on May 28, 2014.

(51) Int. Cl.
  *G06F 12/02* (2006.01)
  *G06F 12/08* (2016.01)
  *G06F 12/0802* (2016.01)
  *G06F 12/1009* (2016.01)

(52) U.S. Cl.
  CPC ...... *G06F 12/0246* (2013.01); *G06F 12/0802* (2013.01); *G06F 12/1009* (2013.01); *G06F 2212/222* (2013.01); *G06F 2212/7201* (2013.01)

(58) Field of Classification Search
  CPC ............. G06F 12/0866; G06F 12/0888; G06F 11/3409; G06F 12/084; G06F 12/0868; G06F 12/122; G06F 12/123; G06F 2201/885; G06F 2212/261; G06F 2212/263
  See application file for complete search history.

(56) References Cited

U.S. PATENT DOCUMENTS

| | | | |
|---|---|---|---|
| 4,429,363 | A | 1/1984 | Duke et al. |
| 5,276,867 | A | 1/1994 | Kenley et al. |
| 5,386,547 | A | 1/1995 | Jouppi |
| 5,440,686 | A | 8/1995 | Dahman et al. |
| 5,564,035 | A | 10/1996 | Lai |
| 5,664,153 | A | 9/1997 | Farrell |
| 5,809,560 | A | 9/1998 | Schneider |
| 6,205,528 | B1 | 3/2001 | Kingsbury et al. |
| 6,487,562 | B1 | 11/2002 | Mason, Jr. et al. |
| 6,618,793 | B2 | 9/2003 | Rozario et al. |
| 6,629,200 | B1 | 9/2003 | Kanamaru et al. |
| 6,633,954 | B1 | 10/2003 | Don et al. |
| 6,715,037 | B2 | 3/2004 | Malcolm |

(Continued)

OTHER PUBLICATIONS

Office Action dated Dec. 11, 2015 for U.S. Appl. No. 14/319,440; 34 Pages.

(Continued)

*Primary Examiner* — Yong Choe
(74) *Attorney, Agent, or Firm* — Daly, Crowley, Mofford & Durkee, LLP (57) ABSTRACT

Methods and apparatus to provide application access to a flash device having page cache memory and storage class memory via a bus by mapping a user process virtual address space, wherein the process for the application resides on a host having a processor with direct cache-line access to the page cache memory, wherein the user process virtual address space includes at least a partial mapping of physical address windows for one or more separate flash devices.

20 Claims, 6 Drawing Sheets

(56) References Cited

U.S. PATENT DOCUMENTS

| | | | |
|---|---|---|---|
| 6,728,837 | B2 | 4/2004 | Wilkes et al. |
| 6,732,242 | B2 | 5/2004 | Hill et al. |
| 6,748,494 | B1 | 6/2004 | Yashiro |
| 6,795,894 | B1 | 9/2004 | Neufeld et al. |
| 6,829,698 | B2 | 12/2004 | Arimilli et al. |
| 6,829,762 | B2 | 12/2004 | Arimilli et al. |
| 6,842,847 | B2 | 1/2005 | Arimilli et al. |
| 6,851,024 | B1 | 2/2005 | Wilkes et al. |
| 6,920,514 | B2 | 7/2005 | Arimilli et al. |
| 6,925,551 | B2 | 8/2005 | Arimilli et al. |
| 7,017,031 | B2 | 3/2006 | Arimilli et al. |
| 7,213,005 | B2 | 5/2007 | Mourad et al. |
| 7,213,248 | B2 | 5/2007 | Arimilli et al. |
| 7,644,239 | B2 | 1/2010 | Ergan et al. |
| 7,856,530 | B1 | 12/2010 | Mu |
| 8,438,339 | B2 | 5/2013 | Krishna et al. |
| 9,021,048 | B2 | 4/2015 | Luna et al. |
| 9,092,156 | B1 | 7/2015 | Xu et al. |
| 2002/0010836 | A1 | 1/2002 | Barroso et al. |
| 2002/0038391 | A1 | 3/2002 | Ido et al. |
| 2003/0101320 | A1 | 5/2003 | Chauvel et al. |
| 2005/0091457 | A1 | 4/2005 | Auld et al. |
| 2005/0097272 | A1 | 5/2005 | Jiang et al. |
| 2005/0172098 | A1 | 8/2005 | Worley |
| 2006/0218349 | A1 | 9/2006 | Oe et al. |
| 2007/0011420 | A1 | 1/2007 | Boss et al. |
| 2008/0256294 | A1 | 10/2008 | Gill |
| 2010/0325352 | A1 | 12/2010 | Schuette et al. |
| 2011/0099335 | A1 | 4/2011 | Scott et al. |
| 2011/0161589 | A1 | 6/2011 | Guthrie et al. |
| 2012/0297113 | A1 | 11/2012 | Belluomini et al. |
| 2012/0317312 | A1 | 12/2012 | Elko et al. |
| 2013/0254462 | A1* | 9/2013 | Whyte .............. H04L 69/324 711/103 |
| 2014/0013053 | A1 | 1/2014 | Sawin et al. |
| 2014/0019650 | A1 | 1/2014 | Li et al. |
| 2014/0082288 | A1 | 3/2014 | Beard et al. |
| 2014/0101370 | A1 | 4/2014 | Chu et al. |
| 2014/0115256 | A1 | 4/2014 | Liu et al. |
| 2014/0129779 | A1 | 5/2014 | Frachtenberg et al. |
| 2014/0156935 | A1 | 6/2014 | Raikin et al. |
| 2014/0223072 | A1 | 8/2014 | Shivashankaraiah et al. |
| 2015/0026403 | A1 | 1/2015 | Ish et al. |
| 2015/0178097 | A1 | 6/2015 | Russinovich |
| 2015/0301931 | A1 | 10/2015 | Ahmad et al. |
| 2015/0324294 | A1 | 11/2015 | Ogawa et al. |
| 2015/0378953 | A1* | 12/2015 | Debbage ............. G06F 13/4221 710/117 |

OTHER PUBLICATIONS

EMC Corporation, "EMC VSPEX with EMC XtremSF and EMC XtremSW Cache;" Design Guide; May 2013; 84 Pages.

"Pointer Basics;" Retrieved on Dec. 17, 2015 from Stanford CS Education Library; https://web.archive.org/web/20120214194251/http://cslibrary.stanford.edu/106; 5 Pages.

"Logical Unit Number (LUN);" Definition from Techopedia.com; Retrieved on Dec. 17, 2015; https://web.archive.org/web/20120113025245/http://www.techopedia.com/defin ition/321/logical-unit-umber-lun; 2 Pages.

Cooney et al., "Prioritization for Cache Systems;" U.S. Appl. No. 14/319,440, filed Jun. 30, 2014; 23 Pages.

Michaud et al., "Methods and Apparatus for Memory Tier Page Cache with Zero File;" U.S. Appl. No. 14/501,112, filed Sep. 30, 2014; 28 Pages.

Clark et al., "Second Caches for Memory and Page Caches;" U.S. Appl. No. 14/564,420; filed Dec. 9, 2014; 21 Pages EMC Corporation, "Introduction to EMC Xtremcache;" White Paper; Nov. 2013; 33 Pages.

EMC Corporation, "EMC VSPEX with EMC XTREMSF And EMC Xtremcache;" Design Guide; Dec. 2013; 95 Pages.

Tam et al., "mlcache: A Flexible Multi-Lateral Cache Simulator;" Proceedings of the $6^{th}$ International Symposium on Modeling, Analysis and Simulation of Computer and Telecommunication Systems; Jul. 19-24, 1998; pp. 19-26; 8 Pages.

Response to U.S. Office Action dated Dec. 11, 2015 corresponding to U.S. Appl. No. 14/319,440; Response filed on Feb. 26, 2016; 33 Pages.

U.S. Final Office Action dated Jun. 3, 2016 corresponding to U.S. Appl. No. 14/319,440; 46 Pages.

Response to U.S. Office Action dated Feb. 23, 2016 corresponding to U.S. Appl. No. 14/501,112; Response filed on Jun. 2, 2016; 10 Pages.

Office Action dated Feb. 23, 2016; For U.S. Appl. No. 14/501,112; 24 pages.

U.S. Notice of Allowance dated Nov. 10, 2016 for U.S. Appl. No. 14/319,440; 21 Pages.

Request for Continued Examination (RCE) and Response to Final Office Action dated Jul. 29, 2016 for U.S. Appl. No. 14/501,112; RCE and Response filed on Oct. 31, 2016; 20 Pages.

Response to Office Action dated Aug. 3, 2016 for U.S. Appl. No. 14/564,420; Response filed Nov. 3, 2016; 16 Pages.

Response to Final Office Action dated Jun. 3, 2016 corresponding to U.S. Appl. No. 14/319,440; Response filed Sep. 22, 2016; 18 Pages.

Advisory Action dated Sep. 30, 2016 corresponding to U.S. Appl. No. 14/319,440; 3 Pages.

U.S. Appl. No. 14/501,112 Final Office Action dated Jul. 29, 2016, 33 pages.

U.S. Final Office Action dated Feb. 10, 2017 for U.S. Appl. No. 14/564,420; 29 Pages.

U.S. Office Action dated Aug. 3, 2016 corresponding to U.S. Appl. No. 14/564,420; 31 Pages.

U.S. Non-Final Office Action dated Mar. 24, 2017 for U.S. Appl. No. 14/501,112; 35 Pages.

\* cited by examiner

METHODS AND APPARATUS FOR DIRECT CACHE-LINE ACCESS TO ATTACHED STORAGE WITH CACHE

CROSS REFERENCE TO RELATED APPLICATIONS

The present application claims the benefit of U.S. Provisional Patent Application No. 62/004,163, filed on May 28, 2014, which is incorporated herein by reference.

BACKGROUND

As is known in the art, storage class memory (SCM) devices can include flash-type memory, such as NAND flash and other non-volatile memory technologies. Such devices are desirable in a wide range of applications. As is also know, a variety of bus standards and protocols can be used be transfer data between applications running on processors located on hosts and peripheral devices. It is desirable to continually improve the performance of computer system that utilize significant amounts of memory.

SUMMARY

In one aspect of the invention, a method comprises: providing application access to a flash device having page cache memory and storage class memory via a bus by mapping a user process virtual address space, wherein the process for the application resides on a host having a processor with direct cache-line access to the page cache memory, wherein the user process virtual address space includes at least a partial mapping of physical address windows for one or more separate flash devices.

The method can further include one or more of the following features: the bus comprises a PCIe bus, the bus comprises a memory channel, the mapping of a flash device is performed by a common device driver for all device mappings, a memory window for a full mapping corresponds to the full addressable size of a flash device, and/or direct access by the application of the page cache memory upon return from a page fault.

In another aspect of the invention, an article comprises: a non-transitory computer-readable medium having stored instructions that enable a machine to: provide application access to a flash device having page cache memory and storage class memory via a bus by mapping a user process virtual address space, wherein the process for the application resides on a host having a processor with direct cache-line access to the page cache memory, wherein the user process virtual address space includes at least a partial mapping of physical address windows for one or more separate flash devices.

The article can further include one or more of the following features: the bus comprises a PCIe bus, the bus comprises a memory channel, the mapping of a flash device is performed by a common device driver for all device mappings, a memory window for a full mapping corresponds to the full addressable size of a flash device, and/or instructions for direct access by the application of the page cache memory upon return from a page fault.

In a further aspect of the invention, a system comprises: a processor; and a memory coupled to the processor, wherein the processor and the memory are configured to: providing application access to a flash device having page cache memory and storage class memory via a bus by mapping a user process virtual address space, wherein the process for the application resides on a host having a processor with direct cache-line access to the page cache memory, wherein the user process virtual address space includes at least a partial mapping of physical address windows for one or more separate flash devices.

The system can further include one or more of the following features: the bus comprises a PCIe bus, the bus comprises a memory channel, a memory window for a full mapping corresponds to the full addressable size of a flash device, and/or direct access by the application of the page cache memory upon return from a page fault.

BRIEF DESCRIPTION OF THE DRAWINGS

The systems and methods sought to be protected herein may be more fully understood from the following detailed description of the drawings, in which.

DETAILED DESCRIPTION

The phrases "computer," "computing system," "computing environment," "processing platform," "data memory and storage system," and "data memory and storage system environment" as used herein with respect to various embodiments are intended to be broadly construed, so as to encompass, for example, private or public cloud computing or storage systems, or parts thereof, as well as other types of systems comprising distributed virtual infrastructure and those not comprising virtual infrastructure. In addition, while particular vendor configurations, terminology, and standards, e.g., PCIe, and the like, are used herein, it understood that these are used to facilitate an understanding of the embodiments described herein and should not be construed to limit the scope of the invention.

The terms "application," "program," "application program," and "computer application program" herein refer to any type of software application, including desktop applications, server applications, database applications, and mobile applications. The terms "application process" and "process" refer to an instance of an application that is being executed within a computing environment. As used herein, the terms "processing thread" and "thread" refer to a sequence of computer instructions which can execute concurrently (or in parallel) with one or more other such sequences.

The term "memory" herein refers to any type of computer memory accessed by an application using memory access programming semantics, including, by way of example, dynamic random access memory (DRAM) and memory-mapped files. Typically, reads or writes to underlying devices are performed by an operating system (OS), not the application. As used herein, the term "storage" refers to any resource that is accessed by the application via input/output (I/O) device semantics, such as read and write system calls. In certain instances, the same physical hardware device could be accessed by the application as either memory or as storage.

As is understood by one or ordinary skill in the art, memory management in a computer system can include paging to store and retrieve data from secondary storage, i.e., external storage for use in main memory. The operating system retrieves data from secondary storage in blocks referred to as pages. Paging is useful in systems having virtual memory to allow the use of secondary storage for data that do not fit into physical random-access memory (RAM).

Paging is performed when a program tries to access pages that are not currently mapped to physical memory, which is referred to as a page fault. When a page fault occurs, in conventional systems the operating system must take control and handle the page fault transparently to the application generating the page fault. In general, the operating system determines the location of the data in secondary storage and obtains an empty page frame in physical memory to use as a container for the data. The requested data is then loaded into the available page frame and page table is updated to refer to the new page frame. Control is returned to the program for transparently retrying the instruction that caused the page fault.

Figure 1:
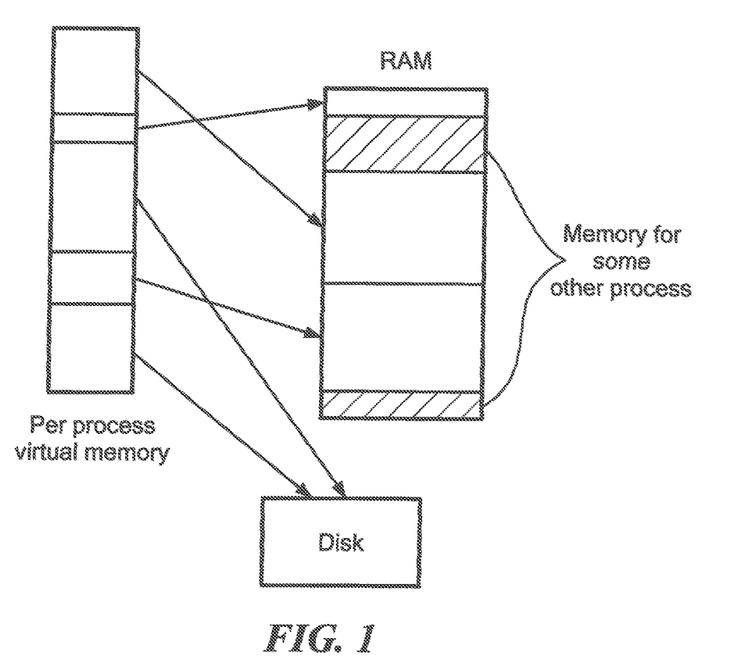
FIG. 1 is a schematic representation of virtual memory.

FIG. 1 shows an illustrative virtual memory implementation that maps memory addresses used by an application referred to as virtual addresses into physical addresses in memory. Main storage as seen by a process appears as a contiguous address space. The operating system manages virtual address spaces and the assignment of physical memory to virtual memory. In a conventional system, a CPU includes address translation circuitry in the CPU known as a memory management unit (MMU) for translating virtual addresses to physical addresses. The operating system may extend these capabilities to provide a virtual address space that can exceed the capacity of real memory and thus reference more memory than is physically present in the system. Virtual memory eliminates the need for applications to manage a shared memory space.

Virtual memory is divided to provide a virtual address space having pages, i.e., blocks of contiguous virtual memory addresses. Page tables are used to translate the virtual addresses seen by the application into physical addresses used by the hardware to process instructions. Page table entries include a flag indicating whether the corresponding page is in physical memory so that for physical memory the page table entry contains the physical memory address at which the page is stored. If a referenced page table entry indicates that it is not currently in physical memory, a page fault exception is generated to be handled by the operating system.

Figure 2:
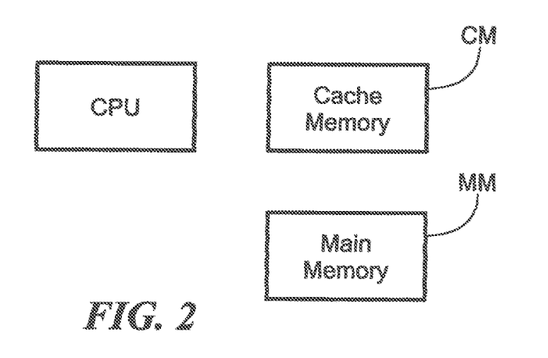
FIG. 2 is a block diagram of an illustrative cache memory.

FIG. 2 shows a system with a CPU that can access main memory MM and cache memory CM. As is known, cache memory CM transparently stores data so that future requests for the data can be accelerated since cache memory access times are less then than for main memory. If there is a cache miss, the data is obtained from main memory. As will be appreciated, the more requested data resides in cache the better the overall performance. As is also known, microprocessors can have many caches, such as data cache and instruction cache. A memory management unit (MMU) that fetches page table entries from main memory includes a translation lookaside buffer (TLB) cache for recording the results of virtual address to physical address translations.

In one aspect of the invention, an adapter, which can be provided as a PCIe adapter, includes flash memory and a page cache, which can be provided as DRAM. Data transfer from flash to page cache on the adapter is localized in comparison to DRAM memory on a host running an application.

In embodiments, memory mapped regions are fronted by a page cache to which an application issues loads and stores. The page cache, which can be provided as DRAM memory, is located on a flash device, such as a PCIe SCM device, and given direct cache-line access from processors. With this configuration, page transfers between the SCM chips and page caches are localized on the PCIe adapter reducing the PCIe bus utilization. On a page fault, the mapping and management of virtual to physical pages is still managed by an OS driver which in turn cooperatively manages translation tables and cache evictions on the PCIe adapter. In one embodiment, upon return from a page fault, the application directly accesses data from the DRAM on the PCIe SCM device directly.

Figure 3A:
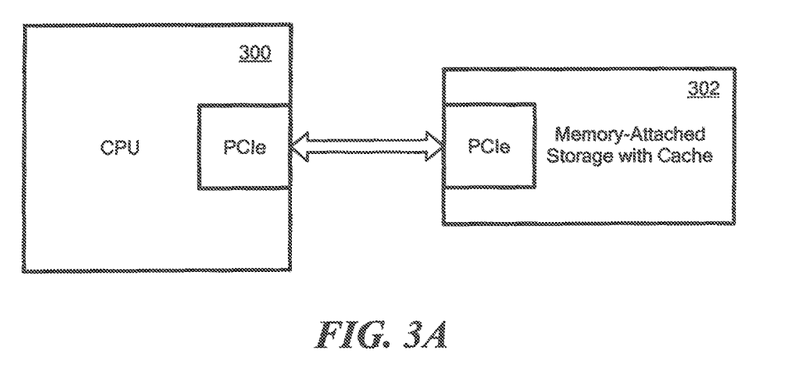
FIG. 3A is a block diagram of a peripheral device coupled to a motherboard via a PCIe interface.

FIG. 3A shows an illustrative CPU 300, which can be provided on a motherboard, for example, connected to a peripheral device 302 via a PCI Express (Peripheral Component Interconnect Express), or PCIe, which is a high-speed serial computer expansion bus standard. PCIe is based on point-to-point topology, with separate serial links connecting every device to the root complex (host). A PCIe link supports full-duplex communication between any two endpoints, with no inherent limitation on concurrent access across multiple endpoints. PCIe communication is encapsulated in packets handled by the transaction layer of the PCIe port. A PCIe link between devices can comprise 1 to 32 lanes. PCIe devices communicate via a logical connection called an interconnect or link, which is a point-to-point communication channel between two PCIe ports, allowing both to send/receive ordinary PCI-requests, such as configuration read/write, I/O read/write, memory read/write and interrupts. At the physical level, a link is composed of one or more lanes. Low-speed peripherals may use a single-lane while high speed peripherals, such as a graphics, card, may use a 16-lane link. A lane is composed of two differential signaling pairs: one pair for receiving data, the other for transmitting. Thus, each lane is composed of four wires or signal traces, where each lane is used as a full-duplex byte stream, transporting data packets in eight-bit 'byte' format, between endpoints of a link, in both directions simultaneously. Physical PCIe slots may contain from one to thirty-two lanes, in powers of two.

Figure 3B:
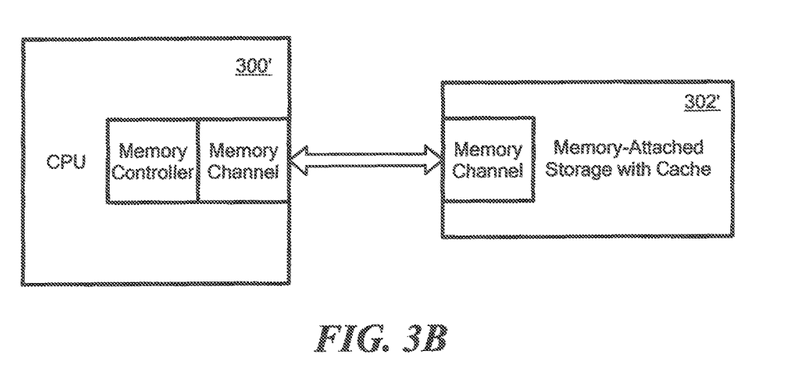
FIG. 3B is a block diagram of a peripheral device connected via a memory channel.

As shown in FIG. 3B, a peripheral device 302' can be connected via a memory channel directly coupled to a CPU 300'. It is understood that other peripheral devices can be coupled using any suitable interface mechanism.

Figure 4:
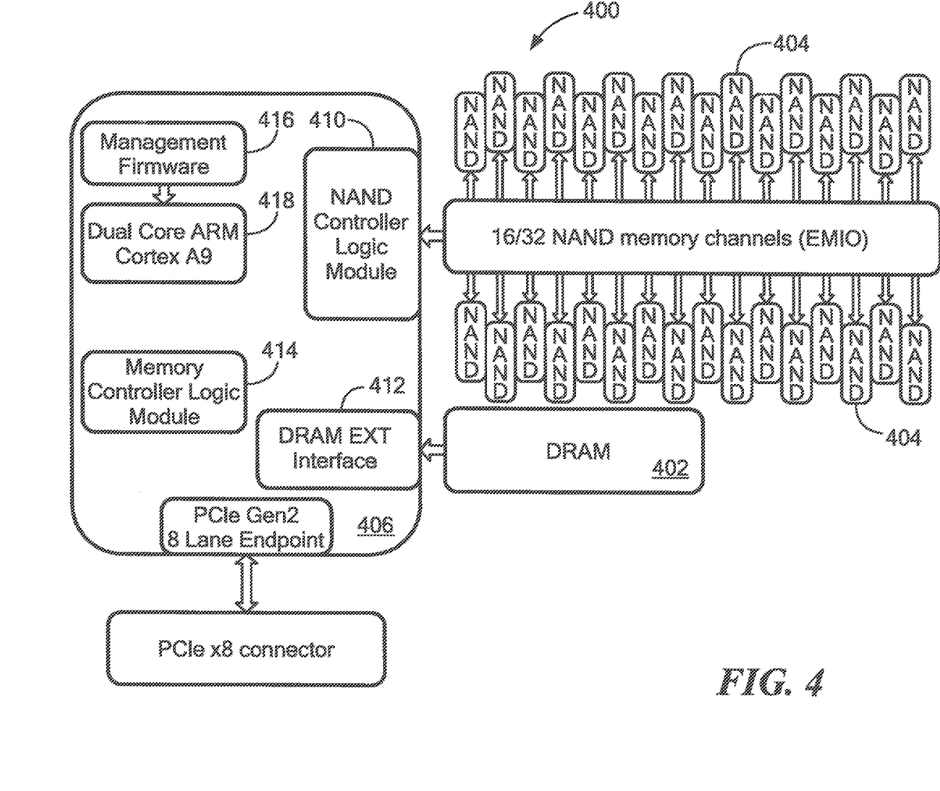
FIG. 4 is a schematic representation of a flash IO device.

FIG. 4 shows an illustrative embodiment to enable an application to have direct access to PCIe flash for tiered memory, for example shown as a PCIe-attached SCM device 400. The page cache memory 402, which can be provided as DRAM, is located on the PCIe SCM device and given direct cache-line access from the processors running an application accessing the device. The page transfers between the SCM chips 404 and page cache 402 are localized on the PCIe adapter 406 reducing the PCIe bus utilization. On a page fault, the mapping and management of virtual to physical pages is still managed by an OS driver which in turn cooperatively manages translation tables and cache evictions on the PCIe adapter. Upon return from a page fault, the application directly accesses data from the DRAM 402 on the PCIe SCM device 400 directly. A flash controller is targeted at platforms that require high performance enterprise-class storage with low latency and high IOPS performance.

The adapter 406 includes a controller 410 to control access to NAND, for example, chips 400 and a DRAM interface 412 to enable access to the DRAM 402. A memory controller logic module 414 provides large PCI memory windows using a management firmware module 416 and a dual core reduced instruction set computing (RISC) system 418, for example to control overall operation of the device 400. Pages in a 'pending' state cause the host to wait for PCIe completion. This allows the host to immediately map pages before they are up to date. The RISC processor 418 provides flash control, MMU TLB miss handling, flash conditioning, etc. The flash controller 410 read/writes flash pages into DRAM 402 via the controller. Many pages can be loaded/flushed in parallel as needed.

With regard to a memory channel or other interface, as shown in FIG. 3B, in general the host side software mechanism remains the same regardless if the flash device is on a PCIe bus, a memory bus, or any suitable internal/external bus that is address decoded and cache configurable by the host. The initial host software setup only differs in where to map the user's address space to, e.g., which physical address(es) are mapped into the user's address space. Configuration differences between a PCIe and a DDR flash controller are contained within the front end logic that is adaptable to any internal/external bus.

Figure 5A:
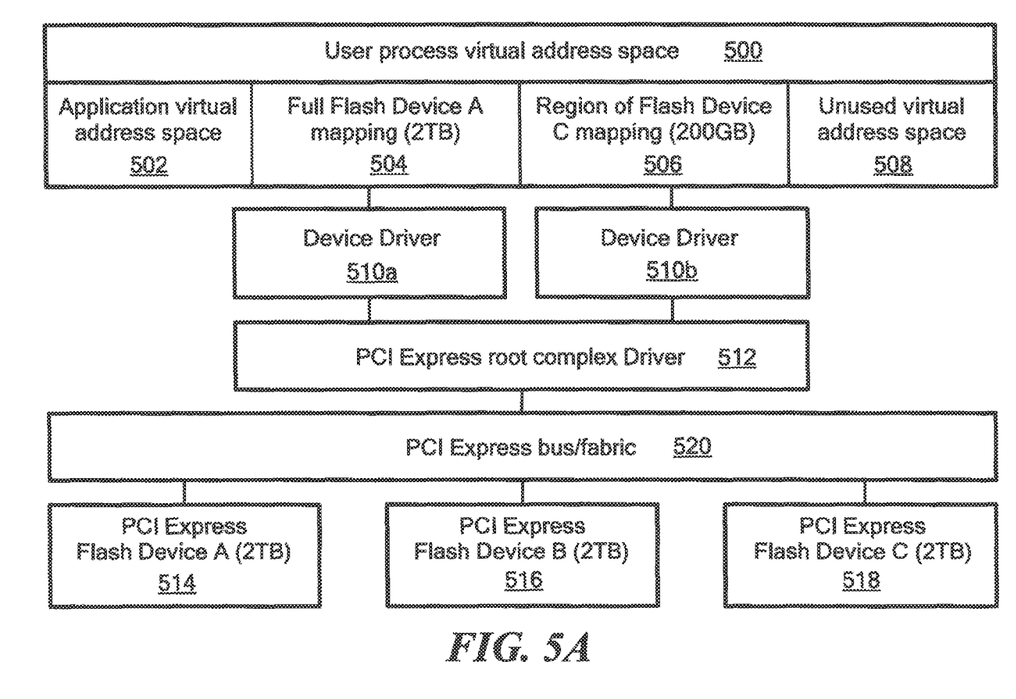
FIG. 5A is a functional block diagram of a flash IO device memory mapped.

FIG. 5A shows a virtual address space 500 for a user process in conjunction with the PCIe SCM device 400 of FIG. 4. The process address space 500 includes a virtual address space 502 for the application and a space 504 for a full flash device that is mapped into the process address space. The process address space 500 further includes a mapping for a region 506 of a flash device mapped into the address space and a mapping for remaining unused virtual address space 508 in this process.

The full flash device mapping 504 and the region of flash mapping 506 are mapped into the process address space by a respective device driver 510a,b. The mappings are directly mapped within the physical address window of the PCI express root complex 512. The PCI Express Flash Device A 514, Device B 516, and Device C 518 are each configured to respond to a full 2 TB, for example, PCI express memory window. Each memory window corresponds to the actual size of each flash device. The Flash devices 514, 516, 518, communicate via a bus/fabric 520.

The full flash device mapping 504 is a complete map of the entire PCI Express Flash Device A 514 into the process virtual address space. The region of flash mapping 506 is a partial map of a portion of PCI Express Flash Device C 518. The portion is typically a partition, or a region of the physical device.

Figure 5B:
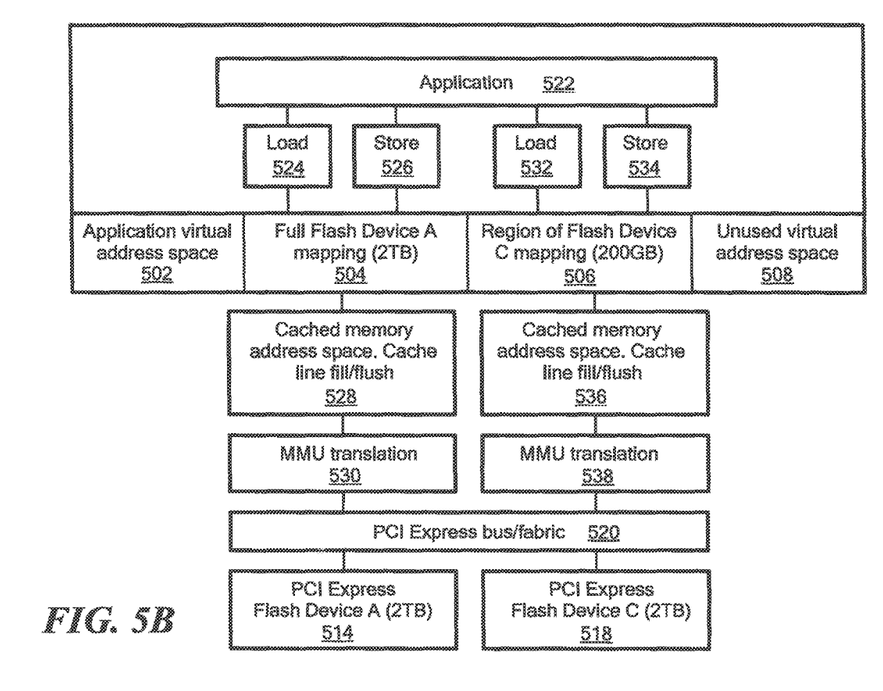
FIG. 5B is a representation of an application load/store to a flash IO device.

FIG. 5B shows an application 522 along with the application virtual address space 502, full Flash device A mapping 504, region of Flash Device C mapping 506 and unused virtual address space 508 of FIG. 5A.

An application load 524 or store 526 to flash device A mapping 504 is marked as cacheable memory 528 and causes the host to fill/flush full cache lines. The virtual address cache line fill/flush requests are validated/translated through the TLB/MMU 530 to a PCI Express physical address and forwarded over the PCI express bus 520 to the PCI express flash device A 514.

An application load 532 or store 534 to flash device C mapping 506 has substantially similar processing including fill/flush full cache lines 536 and TLB/MMU translation 538. However, the device mapping 506 is a partial device mapping. This demonstrates that devices can be fully mapped into a user's address space, or only partially mapped. A partition or a region within a device can be mapped by the user if desired.

While embodiments of the invention are shown and described in conjunction with a PCIe adapter, it is understood that other bus standards can be used without departing from the scope of the claimed invention.

Figure 6:
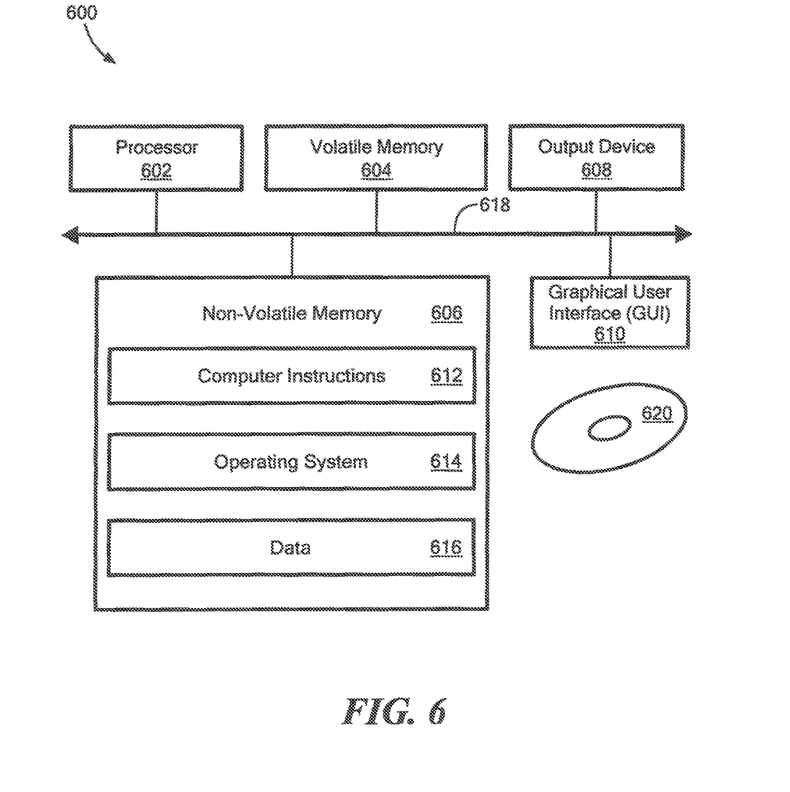
FIG. 6 is a schematic representation of a computer that can perform at least a portion of the processing described herein.

FIG. 6 shows an exemplary computer or other processing device 600 that can perform at least part of the processing described herein. The computer 600 includes a processor 602, a volatile memory 604, a non-volatile memory 606 (e.g., hard disk), an output device 608 and a graphical user interface (GUI) 610 (e.g., a mouse, a keyboard, a display, for example), each of which is coupled together by a bus 618. The non-volatile memory 606 stores computer instructions 612, an operating system 614, and data 616. In one example, the computer instructions 612 are executed by the processor 602 out of volatile memory 604. In one embodiment, an article 620 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Processing may be performed by one or more programmable processors executing one or more computer programs to perform the functions of the system. All or part of the system may be implemented as special purpose logic circuitry (e.g., an FPGA (field programmable gate array) and/or an ASIC (application-specific integrated circuit)).

All references cited herein are hereby incorporated herein by reference in their entirety. A non-transitory machine-readable medium may include but is not limited to a hard drive, compact disc, flash memory, non-volatile memory, volatile memory, magnetic diskette and so forth but does not include a transitory signal per se.

Having described certain embodiments, which serve to illustrate various systems and methods sought to be protected herein, it will now become apparent to those of ordinary skill in the art that other embodiments incorporating these concepts, structures, and techniques may be used. Accordingly, it is submitted that that scope of the patent should not be limited to the described embodiments but rather should be limited only by the spirit and scope of the following claims.

What is claimed is:

1. A method comprising:
providing a process for an application; and
providing the application access to a flash device having page cache memory and storage class memory via a bus by mapping a user process virtual address space, wherein the process for the application resides on a host having a processor with direct cache-line access to the page cache memory, wherein the user process virtual address space includes at least a partial mapping of physical address windows for one or more separate flash devices, wherein the flash device and the processor are located on separate circuit boards connected via the bus.

2. The method according to claim 1, wherein the bus comprises a PCIe (Peripheral Component Interconnect Express) bus.

3. The method according to claim 1, wherein the bus comprises a memory channel.

4. The method according to claim 1, wherein the mapping of a flash device is performed by a common device driver for all device mappings.

5. The method according to claim 1, wherein a memory window for a full mapping corresponds to the full addressable size of a flash device.

6. The method according to claim 1, further including direct access by the application of the page cache memory upon return from a page fault.

7. The method according to claim 1, wherein page transfers between the storage class memory and the page cache are localized on the flash device.

8. An article, comprising:
a non-transitory computer-readable medium having stored instructions that enable a machine to:
provide a process for an application; and
provide the application access to a flash device having page cache memory and storage class memory via a bus by mapping a user process virtual address space, wherein the process for the application resides on a host having a processor with direct cache-line access to the page cache memory, wherein the user process virtual address space includes at least a partial mapping of physical address windows for one or more separate flash devices, wherein the flash device and the processor are located on separate circuit boards connected via the bus.

9. The article according to claim 8, wherein the bus comprises a PCIe (Peripheral Component Interconnect Express) bus.

10. The article according to claim 8, wherein the bus comprises a memory channel.

11. The article according to claim 8, wherein the mapping of a flash device is performed by a common device driver for all device mappings.

12. The article according to claim 8, wherein a memory window for a full mapping corresponds to the full addressable size of a flash device.

13. The article according to claim 8, further including instructions for direct access by the application of the page cache memory upon return from a page fault.

14. The article according to claim 8, wherein page transfers between the storage class memory and the page cache are localized on the flash device.

15. A system, comprising:
a processor;
a memory coupled to the processor, wherein the processor and the memory are configured to:
provide a process for an application; and
provide the application access to a flash device having page cache memory and storage class memory via a bus by mapping a user process virtual address space, wherein the process for the application resides on a host having a processor with direct cache-line access to the page cache memory, wherein the user process virtual address space includes at least a partial mapping of physical address windows for one or more separate flash devices, wherein the flash device and the processor are located on separate circuit boards connected via the bus.

16. The system according to claim 15, wherein the bus comprises a PCIe (Peripheral Component Interconnect Express) bus.

17. The system according to claim 15, wherein the bus comprises a memory channel.

18. The system according to claim 15, wherein a memory window for a full mapping corresponds to the full addressable size of a flash device.

19. The system according to claim 15, further including direct access by the application of the page cache memory upon return from a page fault.

20. The system according to claim 19, wherein page transfers between the storage class memory and the page cache are localized on the flash device.

* * * * *